(12) United States Patent
Kumar et al.

(10) Patent No.: US 6,200,674 B1
(45) Date of Patent: *Mar. 13, 2001

(54) TIN OXIDE PARTICLES

(75) Inventors: Sujeet Kumar, Fremont; Xiangxin Bi, San Ramon; Nobuyuki Kambe, Menlo Park, all of CA (US)

(73) Assignee: NanoGram Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,227

(22) Filed: Mar. 13, 1998

(51) Int. Cl.$^7$ .................................................. C01B 13/00
(52) U.S. Cl. ................. 428/332; 204/157.22; 204/157.5; 423/618; 423/592.96; 257/449; 428/702
(58) Field of Search ..................................... 428/332, 702; 204/157.22, 157.5, 154.41; 423/618, 592, 96; 257/449

(56) References Cited

U.S. PATENT DOCUMENTS

| | | |
|---|---|---|
| 1,119,547 | 12/1914 | Spitz . |
| 1,237,840 | 8/1917 | Terwelp . |
| 1,362,237 | 12/1920 | De Ros . |
| 3,486,913 | 12/1969 | Zirngibl et al. . |
| 4,246,143 | 1/1981 | Sonoda et al. . |
| 4,323,480 | 4/1982 | Dines et al. . |
| 4,478,812 | 10/1984 | Lane . |
| 4,548,798 * | 10/1985 | Rice ...................................... 423/263 |
| 4,588,575 | 5/1986 | David . |
| 4,647,404 | 3/1987 | Morimoto et al. . |
| 4,649,037 | 3/1987 | Marsh et al. . |
| 4,861,572 | 8/1989 | Sugoh et al. . |
| 4,960,324 | 10/1990 | Brown ................................ 350/357 |
| 5,013,706 | 5/1991 | Schramm et al. . |
| 5,014,646 | 5/1991 | Ito et al. ............................... 118/725 |
| 5,062,936 | 11/1991 | Beaty et al. . |
| 5,116,468 | 5/1992 | Giersburg et al. . |
| 5,158,705 | 10/1992 | Swank . |
| 5,221,352 | 6/1993 | Terneu et al. ......................... 118/718 |
| 5,246,623 * | 9/1993 | Giersberg et al. .................... 252/518 |
| 5,304,783 | 4/1994 | Clough et al. ........................ 219/543 |
| 5,330,833 | 7/1994 | Yamashita et al. .................... 428/364 |
| 5,401,441 | 3/1995 | Robert et al. . |
| 5,494,652 | 2/1996 | Robert . |
| 5,569,412 | 10/1996 | Feist et al. . |
| 5,635,154 | 6/1997 | Arai et al. . |
| 5,705,098 | 1/1998 | Okuda et al. . |
| 5,719,016 | 2/1998 | Christian et al. ..................... 430/530 |

OTHER PUBLICATIONS

"Laser synthesis of vanadium–titanium oxide catalysts", M. Musci et al. J. Mater. Res., vol. 7, No. 10, (1992) pp. 2846–2852.

"Synthesis of ultrafine $TiO_2$ powders by a CW $CO_2$ laser", F. Curcio et al. Applied Surface Scince 46 (1990) pp. 225–229.

* cited by examiner

Primary Examiner—William Krynski
Assistant Examiner—Dawn L. Garrett
(74) Attorney, Agent, or Firm—Westman, Champlin & Kelly; Peter S. Dardi

(57) ABSTRACT

Tin oxide nanoparticles were produced with tin in a variety of oxidation states. In particular, nanoparticles of single phase, crystalline $SnO_2$ were produced. Preferred tin oxide nanoparticles have an average diameter from about 5 nm to about 100 nm with an extremely narrow distribution of particle diameters. The tin oxide nanoparticles can be produced in significant quantities using a laser pyrolysis apparatus. Nanoparticles produced by laser pyrolysis can be subjected to further processing to change the properties of the particles without destroying the nanoscale size of the particles. The nanoscale tin oxide particles are useful for the production of transparent electrodes for use in flat panel displays.

21 Claims, 15 Drawing Sheets

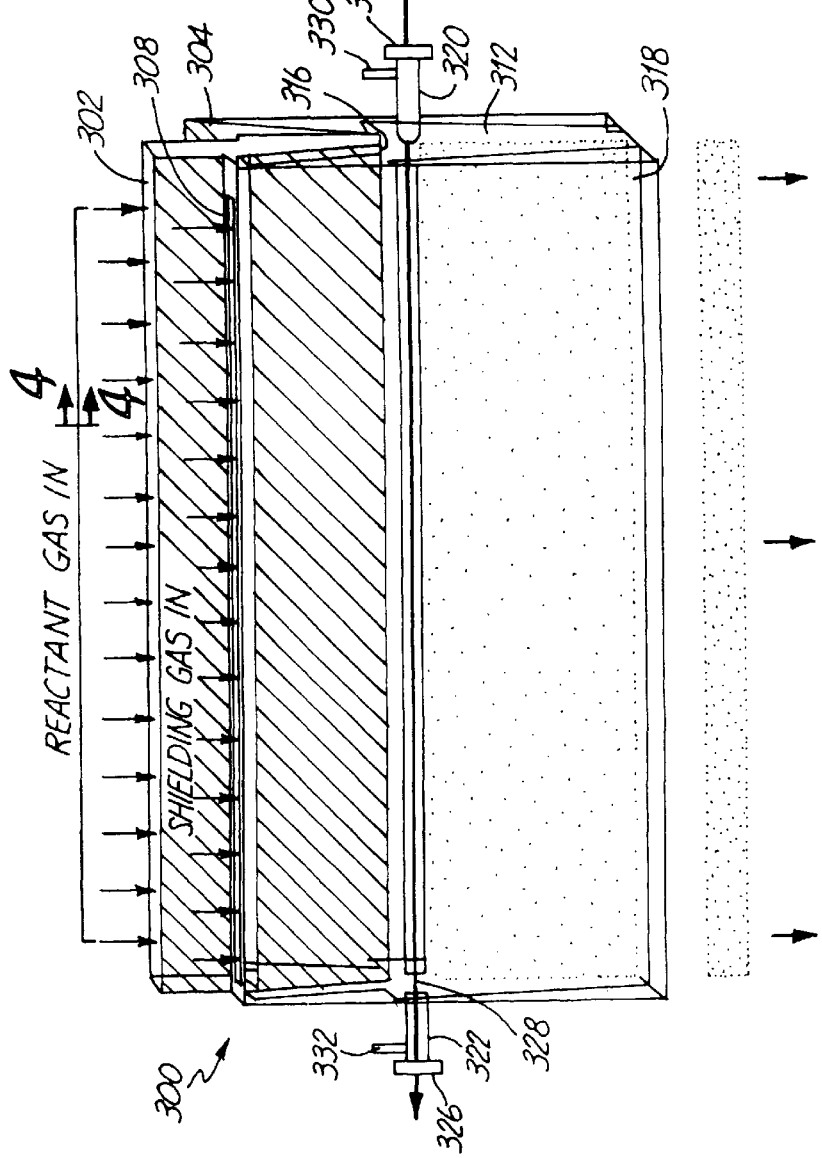
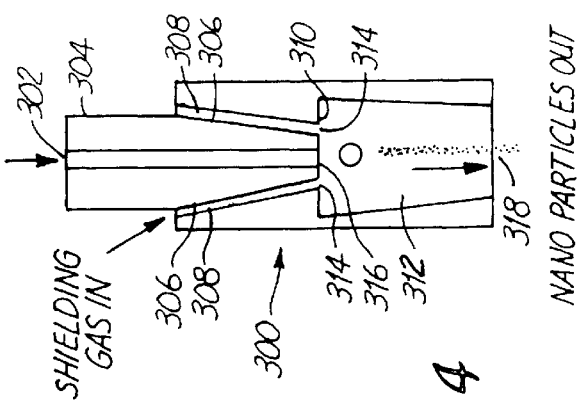

TIN OXIDE PARTICLES

FIELD OF THE INVENTION

The invention relates to tin oxide particles with average diameters on a nanometer scale. The invention further relates to the production of nanoscale tin oxide particles using laser pyrolysis and to transparent electrodes incorporating nanoscale tin oxide particles.

BACKGROUND OF THE INVENTION

Tin oxide can exist with various stoichiometries. In particular, tin oxide exists commonly as SnO or $SnO_2$. $SnO_2$ is an n-type semiconductor with significant conduction at room temperature. Because of its semiconducting property and its relatively high transparency of visible light, $SnO_2$ has been an important component for transparent electrodes in flat-panel displays, generally in combination with indium oxide to form indium tin oxide (ITO). $SnO_2$ has also been useful for producing gas sensors, catalysts, electrostatic charge protection coatings, and other devices. Solution based methods generally are used for the production of small tin oxide particles. These solution based synthesis methods can produce fine powders but are limited with respect to obtainable particle size uniformity.

SUMMARY OF THE INVENTION

Crystalline particles of tin oxide have been produced on a nanometer scale with extremely high particle size uniformity. In particular, the particle size distribution drops off sharply such that there are effectively no particles with diameters substantially smaller or larger than the average diameter. The basis for the synthesis is laser pyrolysis in which radiation pyrolyzes a reactant stream. Additional processing can be used to modify the properties of the particles produced by laser pyrolysis. Different stoichiometric forms of the tin oxide can be produced either directly or with additional processing. The extremely uniform particles are particularly valuable for producing highly transparent electrodes. The small particle size and uniformity yield especially high levels of transparency. The methods of particle production are efficient and provide for the production of large quantities of materials.

In a first aspect, the invention features a collection of particles comprising crystalline tin oxide, the collection of particles having an average diameter of about 500 nm or less, wherein at least about 95 percent of the nanoparticles have a diameter greater than about 50 percent of the average diameter and less than about 150 percent of the average diameter. The collection of particles preferably have an average diameter of about 100 nm or less and more preferably an average diameter from about 5 nm to about 50 nm. The tin oxide nanoparticles can have a stoichiometry of $SnO_2$. Preferably, at least about 99 percent of the nanoparticles have a diameter greater than about 50 percent of the average diameter and less than about 150 percent of the average diameter. Preferably, about 95 percent of the nanoparticles have a diameter greater than about 60 percent of the average diameter and less than about 160 percent of the average diameter. The particles generally are roughly spherical in appearance and have a single crystalline phase.

The invention also features devices including a coating where the coating has tin oxide nanoparticle having an average diameter of about 500 nm or less, wherein at least about 95 percent of the nanoparticles have a diameter greater than about 50 percent of the average diameter and less than about 150 percent of the average diameter. The device can be a gas sensor. The device can include a display wherein the coating functions as a transparent electrode.

In another aspect, the invention features a method of producing tin oxide nanoparticles comprising pyrolyzing a molecular stream in a reaction chamber, the molecular stream including a tin precursor, an oxidizing gas and a radiation absorbing gas. The pyrolysis preferably is driven by heat absorbed from a laser beam such as a $CO_2$ laser. The tin oxide nanoparticles preferably have an average diameter from about 5 nm to about 100 nm. The tin precursor can be $SnCl_4$, and the oxidizing gas can be $O_2$.

In another aspect the invention features an apparatus comprising:

(a) a reaction chamber isolated from the ambient atmosphere;

(b) a reactant gas inlet defining a path of a molecular stream, the inlet being connected to sources of tin precursor, oxygen contributing reagent and a laser absorbing gas;

(c) a laser beam path intersecting the path of the molecular stream; and (d) a product outlet.

The tin precursor can be $SnCl_4$, and the oxygen contributing reactant can be $O_2$. The reactant gas inlet preferably is elongated in one dimension. The apparatus preferably further includes a $CO_2$ laser aligned to produce a laser beam along the laser beam path. The apparatus can further include a carrier gas in fluid communication with the source of tin precursor.

In another aspect, the invention features, a collection of crystalline tin oxide particles yielding a diffraction spectrum with peak positions indicated in FIG. 9.

Other features and advantages of the invention will be apparent from the following detailed description of the invention and from the claims.

BRIEF DESCRIPTION OF THE DRAWINGS

FIG. 3 is a schematic, perspective view of a reaction chamber of an alternative embodiment of the laser pyrolysis apparatus, where the materials of the chamber are depicted as transparent to reveal the interior of the apparatus.

FIG. 4 is a sectional view of the reaction chamber of FIG. 3 taken along line 4—4.

DETAILED DESCRIPTION OF THE INVENTION

Figure 1:
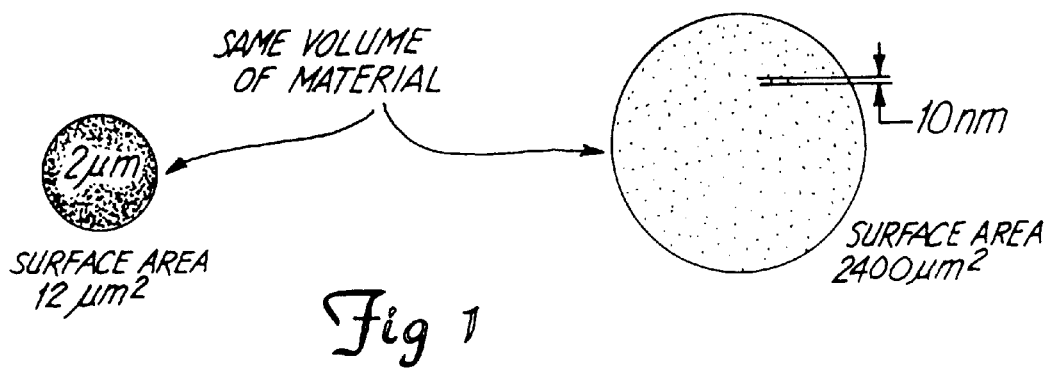
FIG. 1 is a schematic illustration of the effect on surface area of a reduction in particle diameter.

Tin oxide particles having diameters substantially less than a micron have been produced. Tin oxide nanoparticles have been made in a variety of oxidation states such as $SnO_2$. The tin oxide nanoscale particles that have been produced are single phase, crystalline particles. The small size of the particles results in a large surface area per unit weight that can be exploited advantageously in a variety of applications including, for example, in coatings for electronic devices and displays. The large surface area is depicted schematically in FIG. 1. In addition, the tine oxide particles are very highly uniform. In particular, the particles have a very narrow distribution of particle sizes with an effectively complete lack of particles with particle diameters significantly different from the average diameter.

To generate the desired nanoparticles, laser pyrolysis is used either alone or in combination with additional processing. Specifically, laser pyrolysis has been found to be a useful technique for producing a variety of tin oxide nanoparticles with uniform particle size and particle shape. In addition, nanoscale tin oxide particle produced by laser pyrolysis can be subjected to heating in an oxygen environment or an inert environment to alter the properties and/or stoichiometry of the tin oxide particles without destroying the nanoscale size or uniformity.

A basic feature of successful application of laser pyrolysis for the production of tin oxide nanoparticles is the generation of a molecular stream containing a tin precursor, a radiation absorber and an oxygen source. The molecular stream is pyrolyzed preferably by an intense laser beam. The intense heat resulting from the absorption of laser radiation induces the oxidation of the tin precursor in the oxidizing environment. As the molecular stream leaves the laser beam, the tin oxide particles are rapidly quenched.

A. Particle Production

Laser pyrolysis has been discovered to be a valuable tool for the production of nanoscale tin oxide particles. In addition, the particles produced by laser pyrolysis are a convenient material for further processing to expand the pathways for the production of certain tin oxide nanoparticles. Thus, using laser pyrolysis alone or in combination with additional processes, a variety tin oxide particles can be produced.

The reaction conditions determine the qualities of the tin oxide particles produced by laser pyrolysis. The reaction conditions for laser pyrolysis can be controlled relatively precisely in order to produce nanoparticles with desired properties. The appropriate reaction conditions to produce a certain type of particles generally depend on the design of the particular apparatus. Specific conditions used to produce a variety of nanoparticles in a particular apparatus are described below in the Examples. Furthermore, some general observations on the relationship between reaction conditions and the resulting particles can be made.

Increasing the laser power results in increased reaction temperatures in the reaction region as well as a faster quenching rate. A rapid quenching rate tends to favor production of high energy phases, which may not be obtained with processes near thermal equilibrium. Similarly, increasing the chamber pressure also tends to favor the production of higher energy structures. Also, increasing the concentration of the reactant serving as the oxygen source in the reactant stream favors the production of metal oxides with increased amounts of oxygen, i.e., higher oxidation states of tin.

Reactant gas flow rate and velocity of the reactant gas stream are inversely related to particle size so that increasing the reactant gas flow rate or velocity tends to result in smaller particle size. Also, the growth dynamics of the particles have a significant influence on the size of the resulting particles. In other words, certain crystal forms of tin oxide may have a tendency to form different size particles from other crystal forms under relatively similar conditions. Laser power also influences particle size with increased laser power favoring larger particle formation for lower melting materials and smaller particle formation for higher melting materials.

Appropriate precursor compounds generally include tin compounds with reasonable vapor pressures, i.e., vapor pressures sufficient to get desired amounts of precursor vapor in the reactant stream. The vessel holding the precursor compounds can be heated to increase the vapor pressure of the tin precursor, if desired. Preferred tin precursors include, for example, $SnCl_4$ and liquid organometallic tin compounds such as $(C_4H_9)SnCl_3$ (n-butyl tin trichloride), $(CH_2CH)_2 SnCl_2$ (divinyl tin dichloride) and $(C_4H_9)_3 SnCl$ (tri-n-butyl tin chloride). Preferred reactants serving as the oxygen source include, for example, $O_2$, CO, $CO_2$, $O_3$ and mixtures thereof. The reactant compound acting as the oxygen source should not react significantly with the tin precursor prior to entering the reaction zone since this generally would result in the formation of large particles.

Laser pyrolysis can be performed with a variety of optical laser frequencies. Preferred lasers operate in the infrared portion of the electromagnetic spectrum. $CO_2$ lasers are particularly preferred sources of laser light. Infrared absorbers for inclusion in the molecular stream include, for example, $C_2H_4$, $NH_3$, $SF_6$, $SiH_4$ and $O_3$. $O_3$ can act as both an infrared absorber and as an oxygen source. The radiation absorber, such as the infrared absorber, absorbs energy from the radiation beam and distributes the energy to the other reactants to drive the pyrolysis.

Preferably, the energy absorbed from the radiation beam increases the temperature at a tremendous rate, many times the rate that energy generally would be produced even by strongly exothermic reactions under controlled condition. While the process generally involves nonequilibrium conditions, the temperature can be described approximately based on the energy in the absorbing region. The laser pyrolysis process is qualitatively different from the process in a combustion reactor where an energy source initiates a reaction, but the reaction is driven by energy given off by an exothermic reaction.

An inert shielding gas can be used to reduce the amount of reactant and product molecules contacting the reactant chamber components. For the production of tin oxide nanoparticles, appropriate shielding gases include, for example, Ar, He and $N_2$.

An appropriate laser pyrolysis apparatus generally includes a reaction chamber isolated from the ambient environment. A reactant inlet connected to a reactant supply system produces a molecular stream through the reaction chamber. A laser beam path intersects the molecular stream at a reaction zone. The molecular stream continues after the reaction zone to an outlet, where the molecular stream exits the reaction chamber and passes into a collection system. Generally, the laser is located external to the reaction chamber, and the laser beam enters the reaction chamber through an appropriate window.

Figure 2:
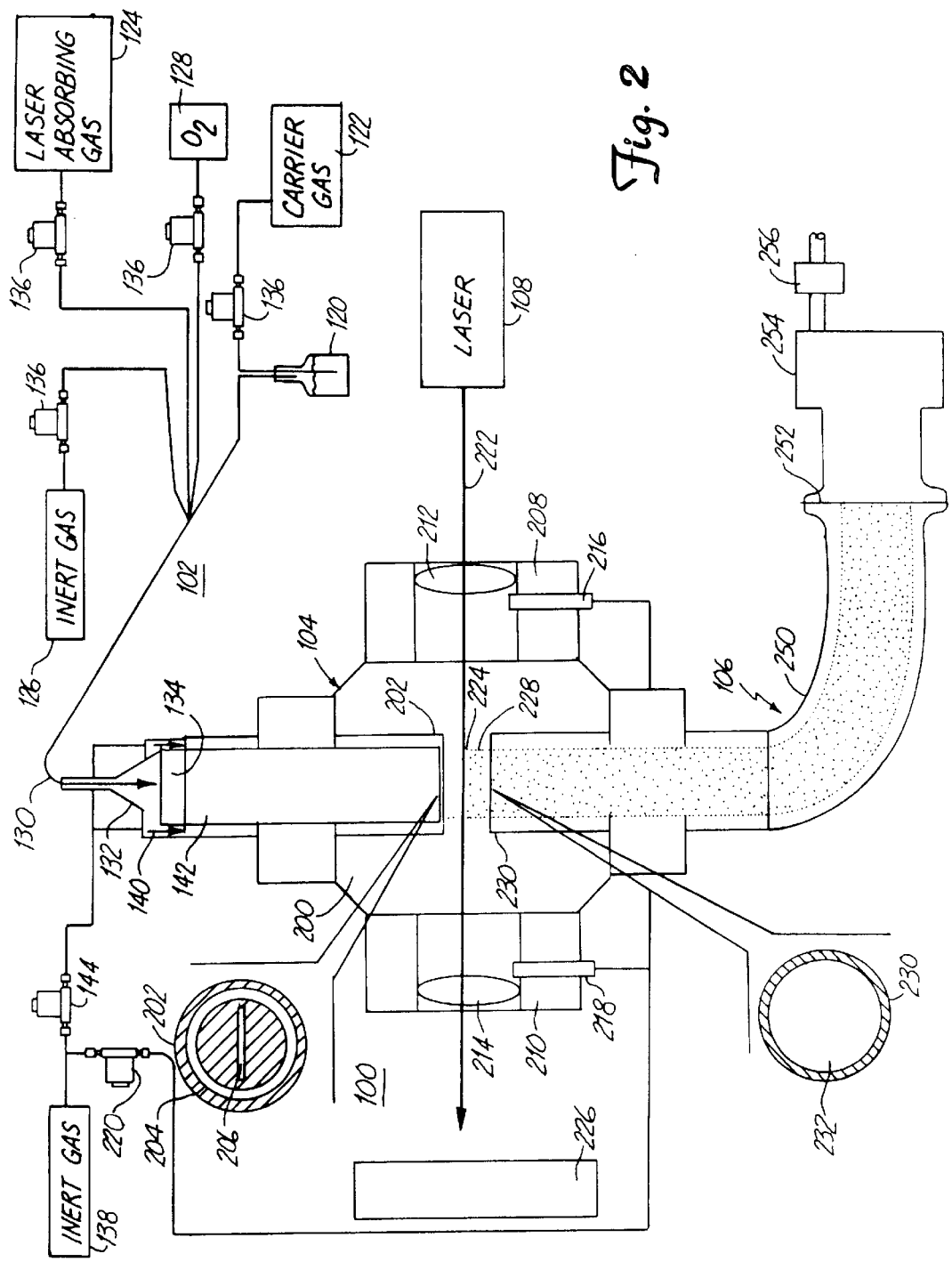
FIG. 2 is a schematic, sectional view of an embodiment of a laser pyrolysis apparatus taken through the middle of the laser radiation path. The upper insert is a bottom view of the injection nozzle, and the lower insert is a top view of the collection nozzle.

Referring to FIG. 2, a particular embodiment 100 of a pyrolysis apparatus involves a reactant supply system 102, reaction chamber 104, collection system 106 and laser 108. Reactant supply system 102 includes a source 120 of precursor compound. For liquid precursors, a carrier gas from carrier gas source 122 can be introduced into precursor source 120, containing liquid precursor to facilitate delivery of the precursor. The carrier gas from source 122 preferably is either an infrared absorber or an inert gas and is preferably bubbled through the liquid tin precursor. The quantity of precursor vapor in the reaction zone is roughly proportional to the flow rate of the carrier gas. Solid tin precursors can be used if they have sufficient vapor pressure. The tin precursor may be heated to increase the vapor pressure to obtain the desired flow rate.

Alternatively, carrier gas can be supplied directly from infrared absorber source 124 or inert gas source 126, as appropriate. The reactant providing the oxygen is supplied from oxygen source 128, which can be a gas cylinder or other suitable container. The gases from the tin precursor source 120 are mixed with gases from oxygen source 128, infrared absorber source 124 and inert gas source 126 by combining the gases in a single portion of tubing 130. The gases preferably are combined a sufficient distance from reaction chamber 104 such that the gases become well mixed prior to their entrance into reaction chamber 104. The combined gas in tube 130 passes through a duct 132 into rectangular channel 134, which forms part of an injection nozzle for directing reactants into the reaction chamber.

Flow from sources 122, 124, 126 and 128 are preferably independently controlled by mass flow controllers 136. Mass flow controllers 136 preferably provide a controlled flow rate from each respective source. Suitable mass flow controllers include, for example, Edwards Mass Flow Controller, Model 825 series, from Edwards High Vacuum International, Wilmington, Mass.

Inert gas source 138 is connected to an inert gas duct 140, which flows into annular channel 142. A mass flow controller 144 regulates the flow of inert gas into inert gas duct 140. Inert gas source 126 can also function as the inert gas source for duct 140, if desired.

The reaction chamber 104 includes a main chamber 200. Reactant supply system 102 connects to the main chamber 200 at injection nozzle 202. The end of injection nozzle 202 has an annular opening 204 for the passage of inert shielding gas, and a rectangular slit 206 for the passage of reactant gases to form a molecular stream in the reaction chamber. Annular opening 204 has, for example, a diameter of about 1.5 inches and a width along the radial direction from about ⅛ in to about 1/16 in. The flow of shielding gas through annular opening 204 helps to prevent the spread of the reactant gases and product particles throughout reaction chamber 104.

Tubular sections 208, 210 are located on either side of injection nozzle 202. Tubular sections 208, 210 include ZnSe windows 212, 214, respectively. Windows 212, 214 are about 1 inch in diameter. Windows 212, 214 are preferably plane-focusing lenses with a focal length equal to the distance between the center of the chamber to the surface of the lens to focus the beam to a point just below the center of the nozzle opening. Windows 212, 214 preferably have an antireflective coating. Appropriate ZnSe lenses are available from Janos Technology, Townshend, Vt. Tubular sections 208, 210 provide for the displacement of windows 212, 214 away from main chamber 200 such that windows 212, 214 are less likely to be contaminated by reactants or products. Window 212, 214 are displaced, for example, about 3 cm from the edge of the main chamber 200.

Windows 212, 214 are sealed with a rubber o-ring to tubular sections 208, 210 to prevent the flow of ambient air into reaction chamber 104. Tubular inlets 216, 218 provide for the flow of shielding gas into tubular sections 208, 210 to reduce the contamination of windows 212, 214. Tubular inlets 216, 218 are connected to inert gas source 138 or to a separate inert gas source. In either case, flow to inlets 216, 218 preferably is controlled by a mass flow controller 220.

Laser 108 is aligned to generate a laser beam 222 that enters window 212 and exits window 214. Windows 212, 214 define a laser light path through main chamber 200 intersecting the flow of reactants at reaction zone 224. After exiting window 214, laser beam 222 strikes power meter 226, which also acts as a beam dump. An appropriate power meter is available from Coherent Inc., Santa Clara, Calif. Laser 108 can be replaced with an intense conventional light source such as an arc lamp. Preferably, laser 108 is an infrared laser, especially a CW $CO_2$ laser such as an 1800 watt maximum power output laser available from PRC Corp., Landing, N.J.

Reactants passing through slit 206 in injection nozzle 202 initiate a molecular stream.

The molecular stream passes through reaction zone 224, where reaction involving the tin precursor takes place. Heating of the gases in reaction zone 224 is extremely rapid, roughly on the order of $10^5$ degree C./sec depending on the specific conditions. The reaction is rapidly quenched upon leaving reaction zone 224, and nanoparticles 228 are formed in the molecular stream. The nonequilibrium nature of the process allows for the production of nanoparticles with a highly uniform size distribution and structural homogeneity.

The path of the molecular stream continues to collection nozzle 230. Collection nozzle 230 is spaced about 2 cm from injection nozzle 202. The small spacing between injection nozzle 202 and collection nozzle 230 helps reduce the contamination of reaction chamber 104 with reactants and products. Collection nozzle 230 has a circular opening 232. Circular opening 232 feeds into collection system 106.

The chamber pressure is monitored with a pressure gauge attached to the main chamber. The chamber pressure generally ranges from about 5 Torr to about 1000 Torr. The preferred chamber pressure for the production of tin oxides ranges from about 80 Torr to about 500 Torr.

Reaction chamber 104 has two additional tubular sections not shown. One of the additional tubular sections projects into the plane of the sectional view in FIG. 2, and the second additional tubular section projects out of the plane of the sectional view in FIG. 2. When viewed from above, the four tubular sections are distributed roughly, symmetrically around the center of the chamber. These additional tubular sections have windows for observing the inside of the chamber. In this configuration of the apparatus, the two additional tubular sections are not used to facilitate production of particles.

Collection system 106 can include a curved channel 250 leading from collection nozzle 230. Because of the small size of the particles, the product particles follow the flow of the gas around curves. Collection system 106 includes a filter 252 within the gas flow to collect the product particles. A variety of materials such as Teflon, glass fibers and the like can be used for the filter as long as the material is inert and has a fine enough mesh to trap the particles. Preferred materials for the filter include, for example, glass fiber filters from ACE Glass Inc., Vineland, N.J. and cylindrical polypropylene filters from Cole-Parmer Instrument Co., Vernon Hills, Ill.

Pump 254 is used to maintain collection system 106 at a selected pressure. A variety of different pumps can be used. Appropriate pumps for use as pump 254 include, for example, Busch Model B0024 pump from Busch, Inc., Virginia Beach, Va. with a pumping capacity of about 25 cubic feet per minute (cfm) and Leybold Model SV300 pump from Leybold Vacuum Products, Export, Pa., with a pumping capacity of about 195 cfm. It may be desirable to flow the exhaust of the pump through a scrubber 256 to remove any remaining reactive chemicals before venting into the atmosphere. The entire apparatus 100 can be placed in a fume hood for ventilation purposes and for safety considerations. Generally, the laser remains outside of the fume hood because of its large size.

The apparatus is controlled by a computer. Generally, the computer controls the laser and monitors the pressure in the reaction chamber. The computer can be used to control the flow of reactants and/or the shielding gas. The pumping rate is controlled by either a manual needle valve or an automatic throttle valve inserted between pump 254 and filter 252. As the chamber pressure increases due to the accumulation of particles on filter 252, the manual valve or the throttle valve can be adjusted to maintain the pumping rate and the corresponding chamber pressure.

The reaction can be continued until sufficient particles are collected on filter 252 such that the pump can no longer maintain the desired pressure in the reaction chamber 104 against the resistance through filter 252. When the pressure in reaction chamber 104 can no longer be maintained at the desired value, the reaction is stopped, and the filter 252 is removed. With this embodiment, about 1–75 grams of particles can be collected in a single run before the chamber pressure can no longer be maintained. A single run generally can last up to about 6 hours depending on the type of particle being produced and the type of filter being used. Therefore, it is straightforward to produce a macroscopic quantity of particles, i.e., a quantity visible with the naked eye.

The reaction conditions can be controlled relatively precisely. The mass flow controllers are quite accurate. The laser generally has about 0.5 percent power stability. With either a manual control or a throttle valve, the chamber pressure can be controlled to within about 1 percent.

The configuration of the reactant supply system 102 and the collection system 106 can be reversed. In this alternative configuration, the reactants are supplied from the bottom of the reaction chamber, and the product particles are collected from the top of the chamber. This alternative configuration can result in a slightly higher collection of product since tin oxide particles tend to be buoyant in the surrounding gases. In this configuration, it is preferable to include a curved section in the collection system so that the collection filter is not mounted directly above the reaction chamber.

An alternative design of a laser pyrolysis apparatus has been described. See, copending and commonly assigned U.S. patent application Ser. No. 08/808,850, entitled "Efficient Production of Particles by Chemical Reaction," incorporated herein by reference. This alternative design is intended to facilitate production of commercial quantities of nanoparticles by laser pyrolysis. A variety of configurations are described for injecting the reactant materials into the reaction chamber.

The alternative apparatus includes a reaction chamber designed to minimize contamination of the walls of the chamber with particles, to increase the production capacity and to make efficient use of resources. To accomplish these objectives, the reaction chamber conforms generally to the shape of an elongated reactant inlet, decreasing the dead volume outside of the molecular stream. Gases can accumulate in dead volume, increasing the amount of wasted radiation through scattering or absorption by nonreacting molecules. Also, due to reduced gas flow in the dead volume, particles can accumulate in the dead volume causing chamber contamination.

The design of the improved reaction chamber 300 is schematically shown in FIGS. 3 and 4. A reactant gas channel 302 is located within block 304. Facets 306 of block 304 form a portion of conduits 308. Another portion of conduits 308 join at edge 310 with an inner surface of main chamber 312. Conduits 308 terminate at shielding gas inlets 314. Block 304 can be repositioned or replaced, depending on the reaction and desired conditions, to vary the relationship between the elongated reactant inlet 316 and shielding gas inlets 314. The shielding gases from shielding gas inlets 314 form blankets around the molecular stream originating from reactant inlet 316.

The dimensions of elongated reactant inlet 316 preferably are designed for high efficiency particle production. Reasonable dimensions for the reactant inlet for the production of tin oxide nanoparticles, when used with a 1800 watt $CO_2$ laser, are from about 5 mm to about 1 meter.

Main chamber 312 conforms generally to the shape of elongated reactant inlet 316. Main chamber 312 includes an outlet 318 along the molecular stream for removal of particulate products, any unreacted gases and inert gases. Tubular sections 320, 322 extend from the main chamber 312. Tubular sections 320, 322 hold windows 324, 326 to define a laser beam path 328 through the reaction chamber 300. Tubular sections 320, 322 can include shielding gas inlets 330, 332 for the introduction of shielding gas into tubular sections 320, 322.

The improved apparatus includes a collection system to remove the nanoparticles from the molecular stream. The collection system can be designed to collect a large quantity of particles without terminating production or, preferably, to run in continuous production by switching between different particle collectors within the collection system. The collection system can include curved components within the flow path similar to curved portion of the collection system shown in FIG. 2. The configuration of the reactant injection components and the collection system can be reversed such that the particles are collected at the top of the apparatus.

As noted above, properties of the tin oxide nanoparticles can be modified by further processing. For example, tin oxide nanoscale particles can be heated in an oven in an oxidizing environment or an inert environment to alter the oxygen content and/or crystal structure of the tin oxide particles. In particular, it has been found that crystalline $SnO_x$ ($1<x<2$) can be converted to crystalline, single phase $SnO_2$ through heat processing in an oxidizing atmosphere. The use of mild conditions, i.e., temperatures well below the melting point of the nanoparticles, results in modification of the stoichiometry and/or crystal structure of tin oxide nanoparticles without significantly sintering the nanoparticles into larger particles.

In addition, to increase the quality of the particles, the heating process can be used to remove adsorbed compounds, such as unreacted or partially reacted precursor, on the particles. For example, tin oxides produced by laser pyrolysis can include a quantity of tin chlorides that can be removed either by oxidation or vaporization during the heating processes. The processing of metal oxide nanoscale particles in an oven is further discussed in copending and commonly assigned, U.S. patent application Ser. No. 08/897,903, filed Jul. 21, 1997, entitled "Processing of Vanadium Oxide Particles With Heat," incorporated herein by reference.

Figure 5:
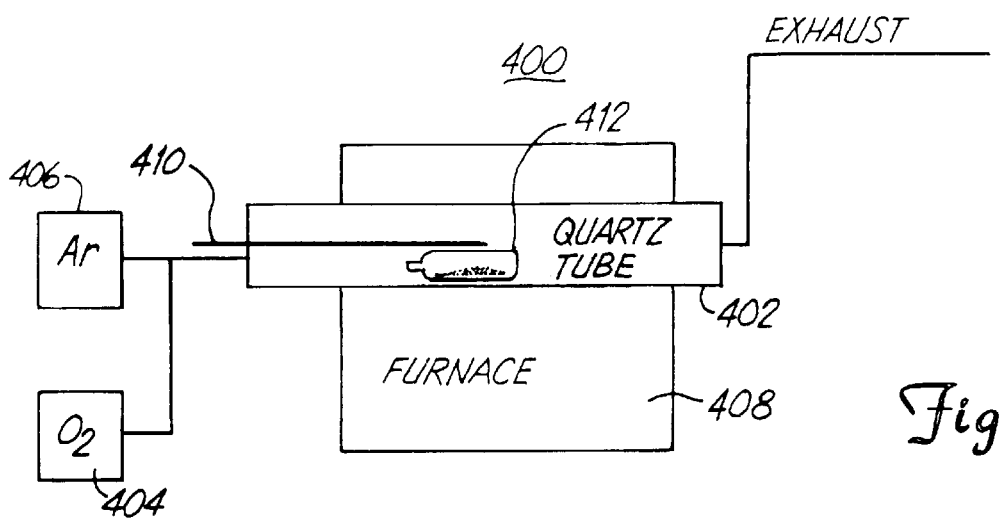
FIG. 5 is a schematic, sectional view of an oven for heating vanadium oxide particles, in which the section is taken through the center of the quartz tube.

A variety of apparatuses can be used to perform the heat processing. An example of an apparatus 400 to perform this processing is displayed in FIG. 5. Apparatus 400 includes a tube 402 into which the particles are placed. Tube 402 is connected to a reactant gas source 404 and inert gas source 406. Reactant gas, inert gas or a combination thereof are placed within tube 402 to produce the desired atmosphere.

Preferably, the desired gases are flowed through tube 402. Appropriate reactant gases to produce an oxidizing environment (oxidizing gas) include, for example, $O_2$, $O_3$, CO, $CO_2$ and combinations thereof. The oxidizing gas can be diluted with inert gases such as Ar, He and $N_2$. The gases in tube 402 can be exclusively inert gases, if desired.

Tube 402 is located within oven or furnace 408. Oven 408 maintains the relevant portions of the tube at a relatively constant temperature, although the temperature can be varied systematically through the processing step, if desired. Temperature in oven 408 generally is measured with a thermocouple 410. The tin oxide particles can be placed in tube 402 within a vial 412. Vial 412 prevents loss of the particles due to gas flow. Vial 412 generally is oriented with the open end directed toward the direction of the source of the gas flow.

The precise conditions including type of oxidizing gas (if any), concentration of oxidizing gas, pressure or flow rate of gas, temperature and processing time can be selected to produce the desired type of product material. The temperatures generally are mild, i.e., significantly below the melting point of the material. The use of mild conditions avoids interparticle sintering resulting in larger particle sizes. Some controlled sintering of tin oxide particles can be performed in oven 408 at somewhat higher temperatures to produce slightly larger average particle diameters.

For the processing of tin oxide, the temperatures preferably range from about 50° C. to about 800° C., and more preferably from about 100° C. to about 400° C. The particles preferably are heated for about 1 hour to about 100 hours. Some empirical adjustment may be required to produce the conditions appropriate for yielding a desired material.

B. Particle Properties

Tin oxide has an intricate phase diagram due to the several possible oxidation states of tin. Tin is known to exist in oxidation states between $Sn^{+2}$ and $Sn^{+4}$. Therefore, it is possible to produce mixed valence compounds in addition to compounds with integral oxidation states of tin. Mixed valence tin oxide compounds can be expressed as $SnO_x$, where $1<x<2$. Known forms of tin oxide include SnO, $Sn_3O_4$, $Sn_2O_3$, $Sn_3O_5$, and $SnO_2$. The present processing approaches can be used to produce single phase tin oxide in several different oxidation states, as evidenced by x-ray diffraction studies. These single phase materials are generally crystalline.

There likely are mixed phase regions of the tin oxide phase diagram. Mixed phase regions may be accessible through laser pyrolysis. In the mixed phase regions, particles can be formed that have domains with different oxidation states, or different particles can be simultaneously formed with tin in different oxidation states. In other words, certain particles or portions of particles have different stoichiometry.

Tin oxides generally form crystals with tetragonal or triclinic coordination. Specifically, SnO and $SnO_2$ can form crystals with tetragonal coordination. In addition, $Sn_3O_4$ and $Sn_2O_3$ can form crystals with triclinic coordination. When produced under appropriate conditions, tin oxide particles can be amorphous. The crystalline lattice of tin oxide nanoparticles can be evaluated using x-ray diffraction measurements.

A collection of tin oxide nanoparticles preferably has an average diameter of less than about 500 nm and more preferably from about 5 nm to about 100 nm, and even more preferably from about 5 nm to about 50 nm. The nanoparticles generally have a roughly spherical gross appearance. Upon closer examination, the particles generally have facets corresponding to the underlying crystal lattice. Nevertheless, the nanoparticles tend to exhibit growth that is roughly equal in the three physical dimensions to give a gross spherical appearance. Generally, 95 percent of the particles, and preferably 99 percent, have ratios of the dimension along the major axis to the dimension along either minor axis less than about 2. Diameter measurements on particles with asymmetries are based on an average of length measurements along the principle axes of the particle. The measurements along the principle axes preferably are each less than about 500 nm for at least about 95 percent of the particles, and more preferably for at least about 99 percent of the particles.

Because of their small size, the particles tend to form loose agglomerates due to van der Waals and electrostatic forces between nearby particles. Nevertheless, the nanometer scale of the particles (i.e., primary particles) is clearly observable in transmission electron micrographs of the particles. For crystalline particles, the particle size generally corresponds to the crystal size. The particles have a surface area corresponding to particles on a nanometer scale as observed in the micrographs. Furthermore, the particles manifest unique properties due to their small size and large surface area per unit weight of material. For example, tin oxide nanoparticles have improved transparency to visible light. This improved transparency is useful for the production of transparent electrodes.

The particles preferably have a high degree of uniformity in size. As determined from examination of transmission electron micrographs, the particles generally have a distribution in sizes such that at least about 95 percent of the particles, and preferably 99 percent, have a diameter greater than about 40 percent of the average diameter and less than about 160 percent of the average diameter. Preferably, the particles have a distribution of diameters such that at least about 95 percent of the particles, and preferably 99 percent, have a diameter greater than about 60 percent of the average diameter and less than about 140 percent of the average diameter.

Furthermore, essentially no particles have an average diameter greater than about 5 times, and preferably 3 times , the average diameter. In other words, the particle size distribution effectively does not have a tail indicative of a small number of particles with significantly larger sizes. This is a result of the small reaction region and corresponding rapid quench of the particles. Preferably, less than about 1 particle in 10⁶ have a diameter greater than about 5 times, and preferably 3 times, the average diameter. The narrow size distributions and lack of a tail in the distributions can be exploited in a variety of applications, such as applications involving the formation of coatings or films.

In addition, the tin oxide nanoparticles generally have a very high uniformity with respect to displaying a single crystalline phase. Primary particles generally consist of single crystals of the material. The single phase, single crystal properties of the particles can be used advantageously along with the uniformity and narrow size distribution. Also, excluding the possible presence of unreacted or partly reacted precursor, tin oxide nanoparticles produced by the above methods generally have a purity greater than the reactant gases because the crystal formation process tends to exclude contaminants from the lattice. Furthermore, particles produced by laser pyrolysis generally have been found to have a high degree of crystallinity. High degrees of crystallinity may be desirable for some applications.

C. Devices Formed From Tin Oxide Nanoparticles

The extremely high degree of uniformity and crystallinity can be exploited favorably in a number of applications. In addition, the laser pyrolysis approach, with or without additional processing, provides an efficient and economical route to the production of commercial devices. In particular, the tin oxide nanoparticles described herein are particularly useful in the production of transparent electrodes for displays and solar cells and of gas sensors.

Transparent electrodes can be required for the production of flat panel displays based on field emission devices and liquid crystal (electroluminescent) displays and for the production of solar cells. Improving the transparency of the electrode decreases the power consumption required. If desired to increase the conductivity, the tin oxide particles can be combined with indium oxide particles.

To form the transparent electrodes, the tin oxide nanoparticles, mixed with a binder, can be formed as a coating that functions as the transparent electrode. A variety of standard coating approaches such as a knife edge coating process or spray coating process can be used to form the transparent electrode.

Nanoparticles can be used to produce gas sensors with improved sensitivity due to the significantly increased surface area of the nanoparticles. Furthermore, the extremely high uniformity and crystallinity of the nanoparticles described herein should improve the uniformity and reliability of the gas sensitive coating used to form the gas sensor device, while reducing the quantity of materials needed. Gas sensors commonly are used for safety considerations where reliability is paramount. A layer or coating including tin oxide particles is formed in contact with an electrode. The sensor can include a heater to maintain the sensor at a selected temperature. To alter or increase the sensitivity to certain gases, additional compounds can be included in the tin oxide layer such as antimony bearing compounds, $CeO_2$, $SiO_2$, $TiO_2$ and $ZrO_2$. The combination of antimony bearing compounds with tin oxide is described in U.S. Pat. No. 5,427,740 To Coles et al., entitled "Tin oxide gas sensor," incorporated herein by reference.

EXAMPLES

These examples demonstrate the production of tin oxide nanoparticles with various lattices and stoichiometries. Furthermore, the particles have extremely high size uniformity. The particles described in Examples 1–3 were produced using essentially the laser pyrolysis apparatus of FIG. 2 described above. The tin oxide nanoparticles described in Example 4 were the product of further processing in essentially an apparatus of FIG. 5, described above, starting with nanoparticles initially produced in the laser pyrolysis apparatus of FIG. 2.

Example 1—Crystalline $SnO_x$ ($1<x<2$), Sample 1

The synthesis of $SnO_x$ described in this example was performed by laser pyrolysis. The $SnCl_4$ (Strem Chemical, Inc., Newburyport, Mass.) precursor vapor was carried into the reaction chamber by bubbling Ar gas through the $SnCl_4$ liquid in a container at room temperature. $C_2H_4$ gas was used as a laser absorbing gas, and Argon was used as an inert gas. The reactant gas mixture containing $SnCl_4$, Ar, $O_2$ and $C_2H_4$ is introduced into the reactant gas nozzle for injection into the reaction chamber. The reactant gas nozzle has an opening with dimensions as specified in the first column of Table 1. Additional parameters of the laser pyrolysis synthesis relating to the particles of Example 1 also are specified in the first column of Table 1.

| Stoichiometry | $SnO_x$ | $SnO_x$ | $SnO_x$ |
|---|---|---|---|
| Crystal Structure | Tetragonal | Tetragonal | Tetragonal |
| Pressure (Torr) | 320 | 320 | 180 |
| Argon - Win. (sccm) | 700 | 700 | 700 |
| Argon - Sld. (slm) | 1.96 | 1.96 | 1.96 |
| Carrier Gas (sccm) | 280 (Ar) | 280 (Ar) | 280 (Ar) |
| Ethylene (sccm) | 1206 | 444 | 681 |
| Oxygen (sccm) | 554 | 218 | 484 |
| Laser Output (watts) | 380 | 430 | 430 |
| Nozzle Size | ⅝ in × ⅛ in | ⅝ in × 1/16 in | ⅝ in × ⅛ in | sccm = standard cubic centimeters per minute
slm = standard liters per minute
Argon - Win. = argon flow through inlets 216, 218
Argon - Sld. = argon flow through annular channel 142

Figure 6:
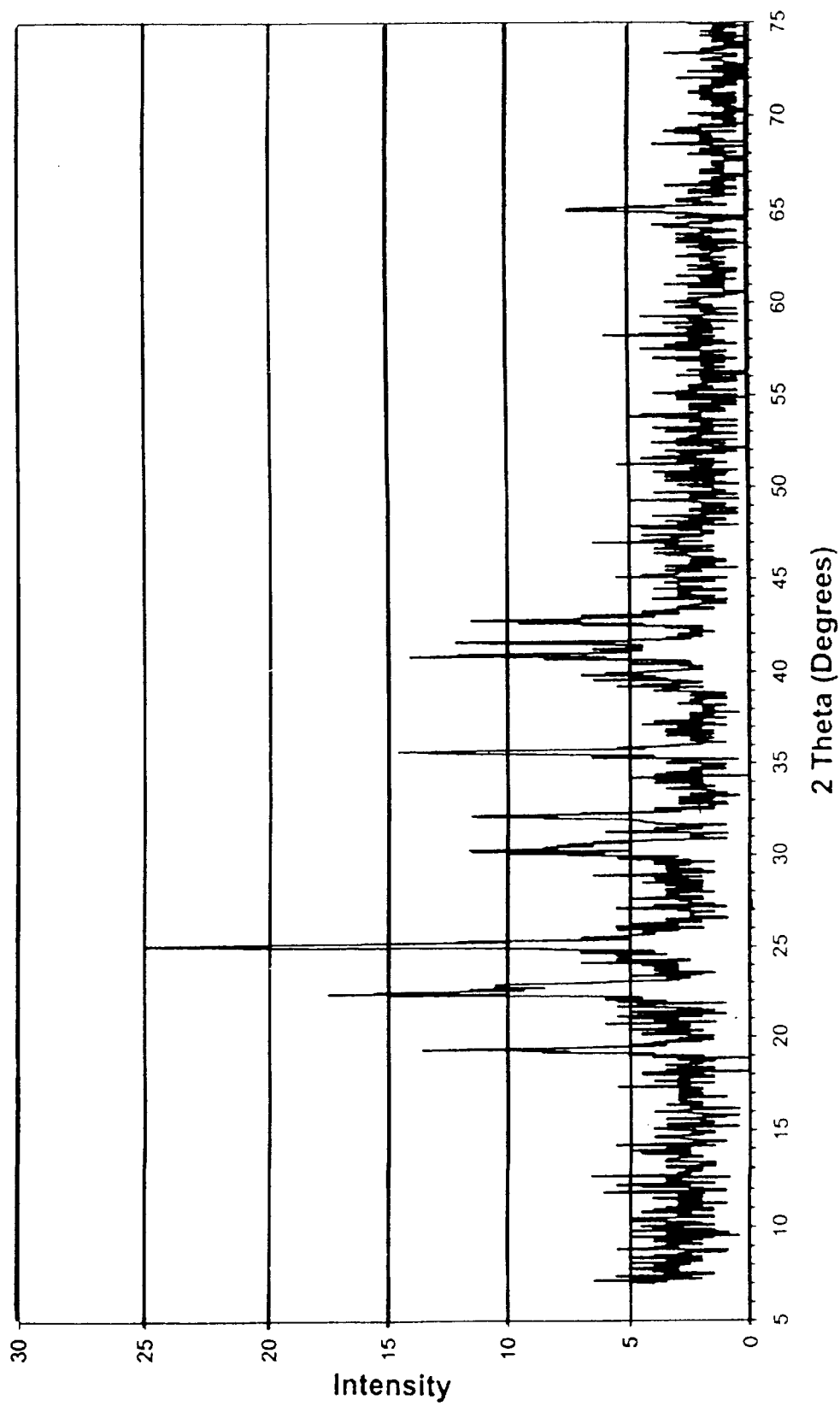
FIG. 6 is an x-ray diffractogram of $SnO_x$ nanoparticles of Example 1.
Figure 7:
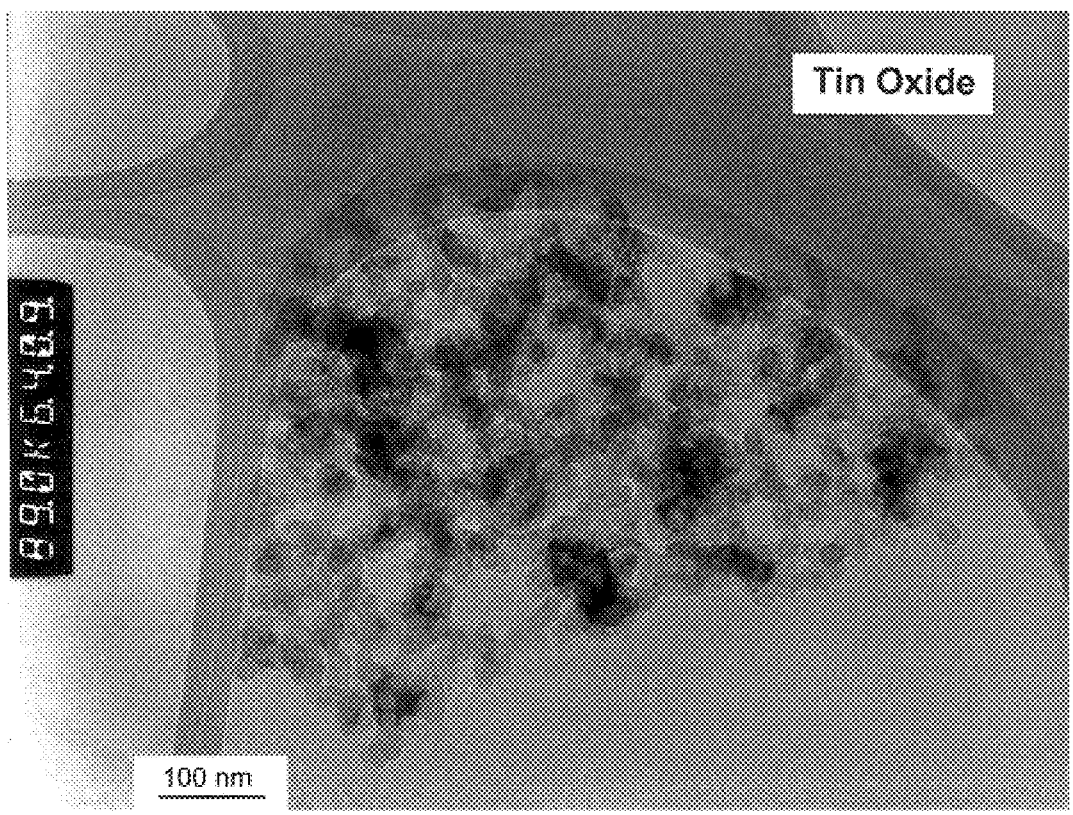
FIG. 7 is a TEM micrograph of nanoparticles of Example 1.

The synthesized tin oxide nanoparticles could be handled directly in air. The production rate of nanoparticles was typically about 5–10 g/hr. Under the conditions specified in the first column of Table 1, crystalline $SnO_x$ was produced. To evaluate the crystal lattice, the samples were examined by x-ray diffraction using the Cu(Kα) radiation line on a Siemens D500 x-ray diffractometer. The x-ray diffractogram is displayed in FIG. 6. More than 10 peaks indicative of a crystalline phase were observed between 18 and 60 degrees. Transmission electron microscopy (TEM) was used to determine particle sizes and morphology. A TEM micrograph is displayed in FIG. 7.

Figure 8:
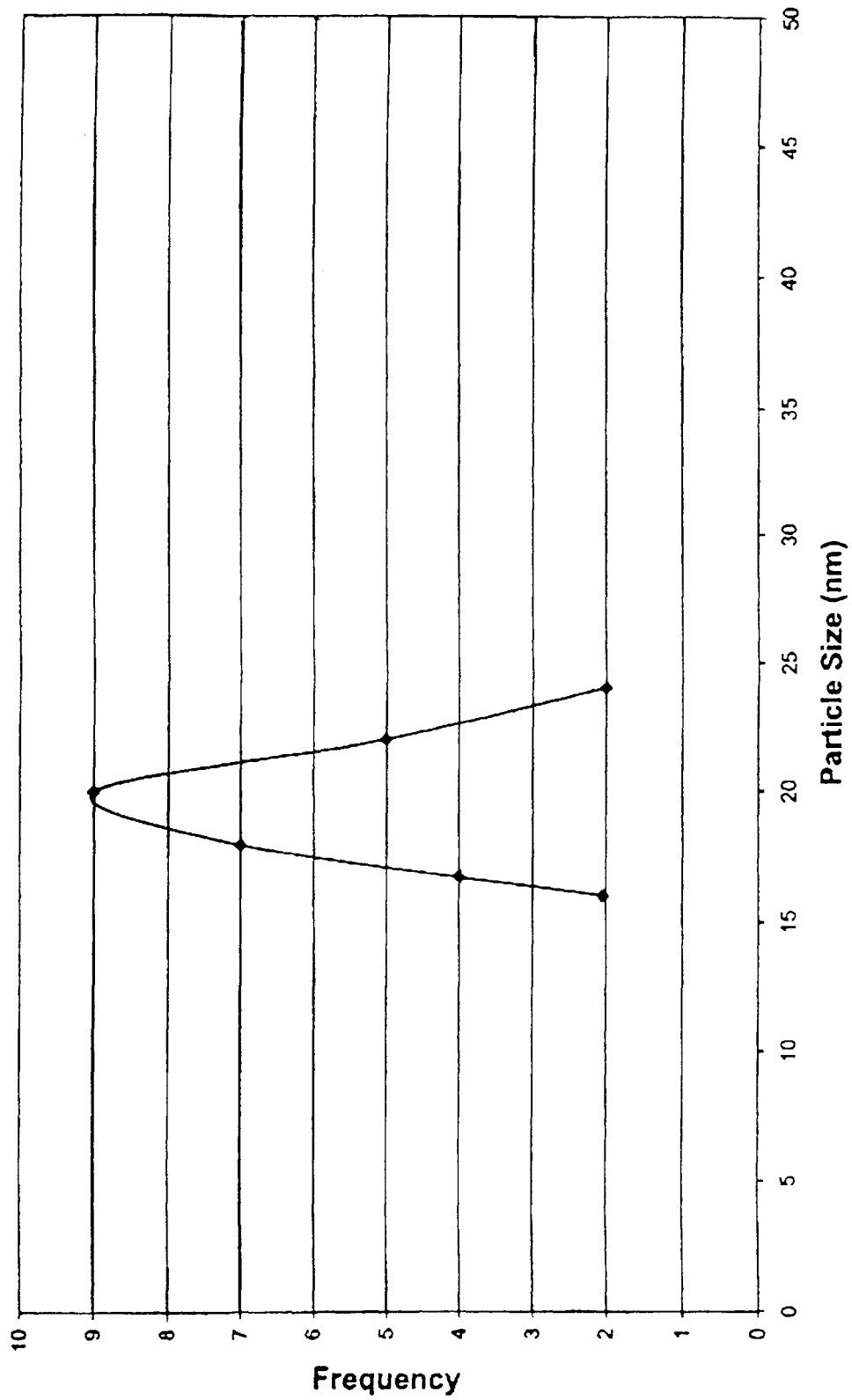
FIG. 8 is a plot of the distribution of particle diameters for the nanoparticles of Example 1 based on the micrograph of FIG. 7.

An examination of a portion of the TEM micrograph yielded an average particle size of about 20 nm. The corresponding particle size distribution is shown in FIG. 8. Behind the nanoparticles, images of carbon films used to hold the nanoparticles can be seen. The approximate size distribution was determined by manually measuring diameters of the particles distinctly visible in the micrograph of FIG. 7. Only those particles having clear particle boundaries were measured, to avoid regions distorted or out of focus in the micrograph. Measurements so obtained should be more accurate and are not biased since a single view in the micrograph cannot show a clear view of all particles because of the orientation of the crystals. It is significant that the particles span a rather narrow range of sizes.

Figure 9:
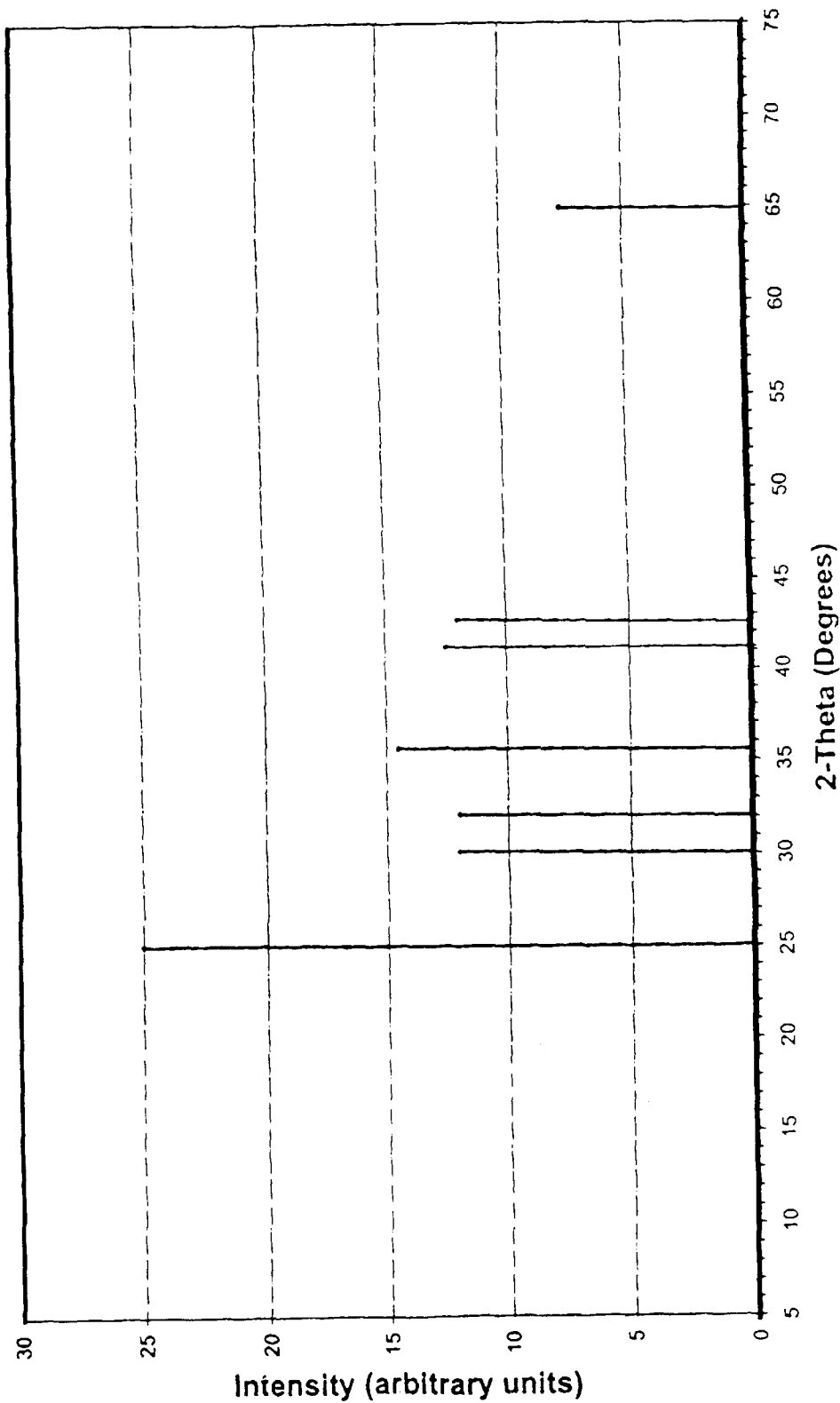
FIG. 9 is a plot indicating the position of x-ray diffraction peaks resulting from tin oxide in FIG. 6, with contributions from $SnCl_2$ being removed.

The tin oxide nanoscale sample evidently contained some residual tin chlorides, $SnCl_2$. This was evident from dark regions in the micrograph as well as the appearance of certain lines in the x-ray diffractogram. Nevertheless, the tin chlorides were distinct materials not disturbing the tin oxide lattice as is evident by the crystallinity of the sample and the distinct identification of specific lines in the diffractogram with the tin chlorides and other lines with the tin oxides. The specific lines in the diffractogram corresponding to tin oxide could be associated with a tetragonal lattice. The pattern of lines, however, could not be associated with any known tin oxide material or combination of known materials (mixed phase). Evidently, the nanoparticles produced have a stoichiometry and/or lattice structure different from known tin oxide materials. Removing the contributions to the diffractogram from $SnCl_2$, diffraction peaks due to the new tin oxide material can be identified. These peaks from the new tin oxide material are plotted in FIG. 9.

Example 2—$SnO_x$ (1<x<2), Sample 2

These particles were produced using a similar laser pyrolysis apparatus as described in Example 1. For the production of particle described in this example, the reactant gas nozzle had dimensions of ⅝ in×¹⁄₁₆ in. The reaction conditions used to produce the particles described in Example 2 are presented in the second column of Table 1.

Figure 10:
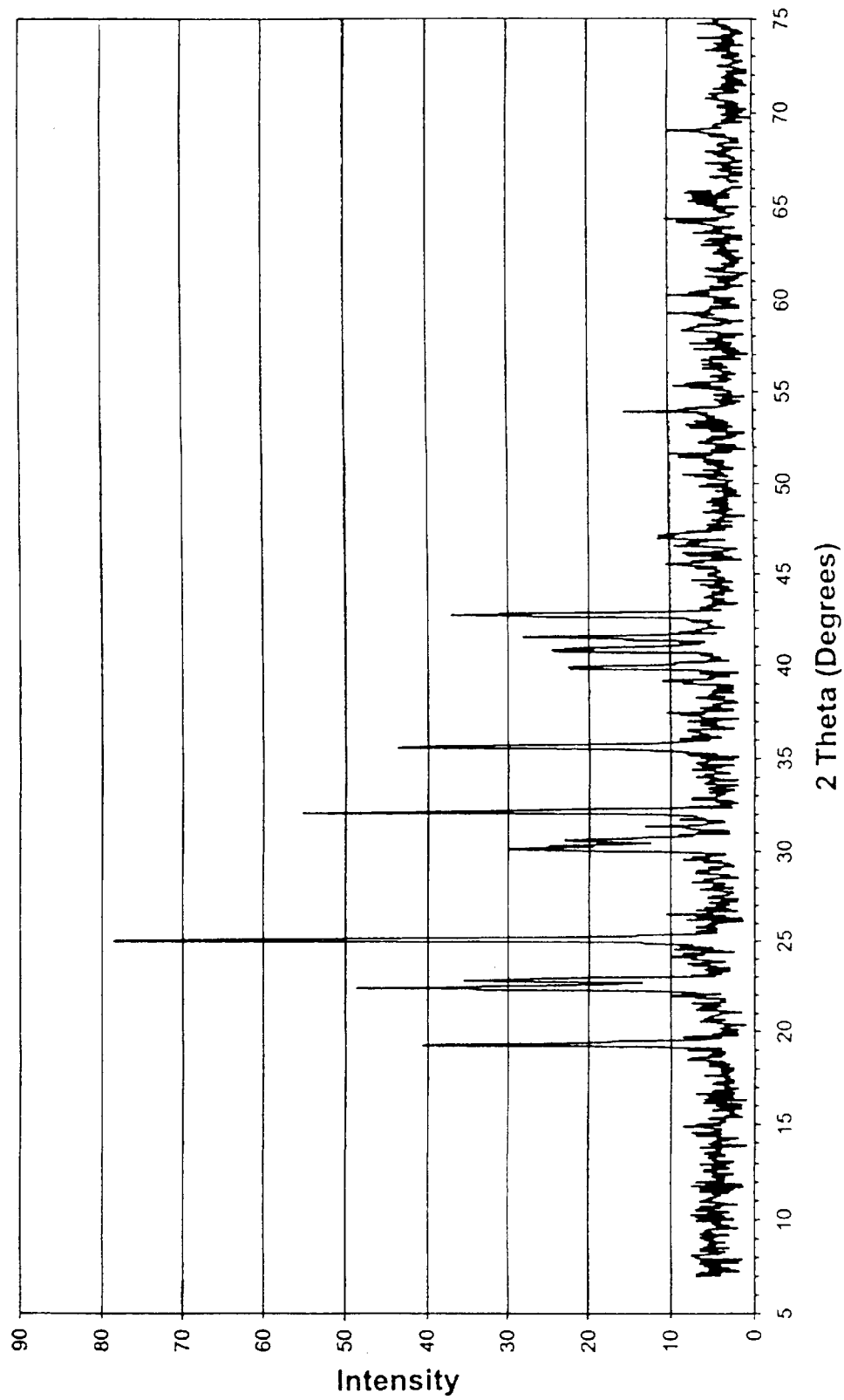
FIG. 10 is an x-ray diffractogram of $SnO_x$ nanoparticles of Example 2.

An x-ray diffractogram of representative product nanoparticles is shown in FIG. 10. Clear diffraction peaks corresponding to a tetragonal crystalline structure are visible. The diffractogram in FIG. 10 is very similar to the diffractogram in FIG. 6 indicating that the crystals involved the same underlying lattice and stoichiometry. The peaks in FIG. 10 are sharper than in FIG. 6 indicating that the particles used to obtain FIG. 10 has a larger particle size and/or a higher degree of crystallinity.

Figure 11:
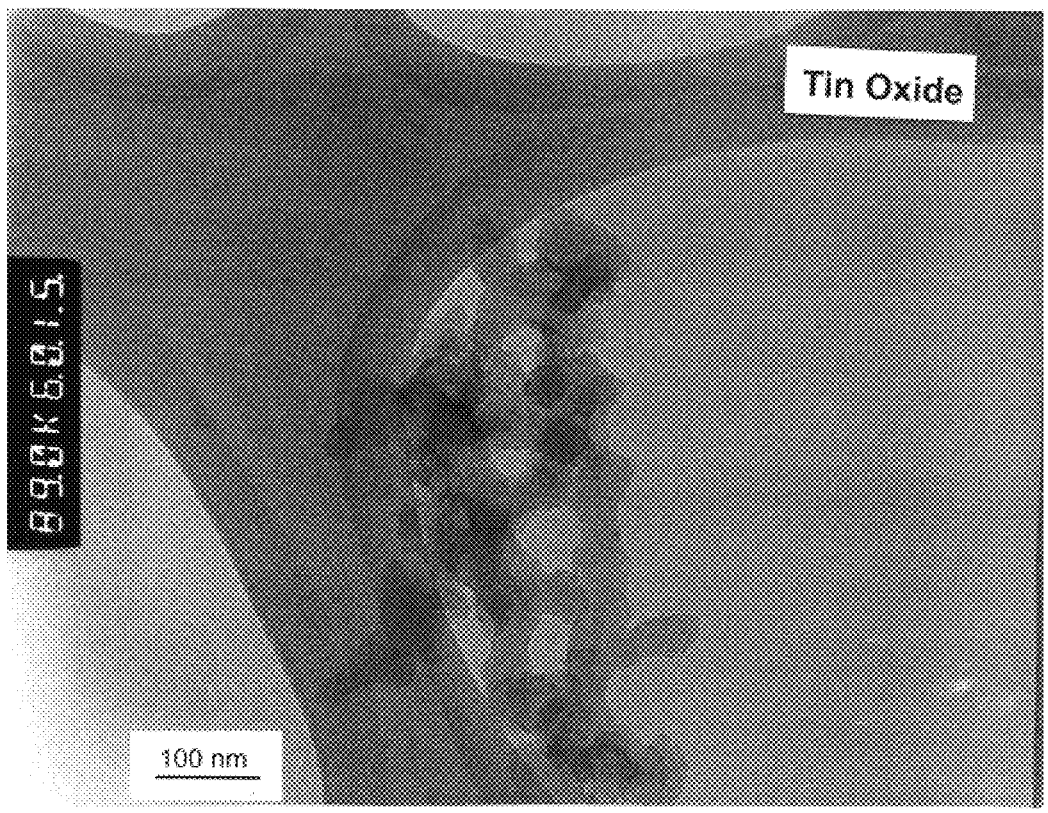
FIG. 11 is a TEM micrograph of nanoparticles of Example 2.

TEM micrographs at high magnification were obtained for the particles in this example, as shown in FIG. 11. Again, the particles span a rather narrow range of sizes. In this case, the largest to smallest particles differ by no more than about 15 nm in diameter. An average particle size of about 45 nm was obtained.

Example 3—Crystalline $SnO_x$, Sample 3

The experimental arrangement for the production of the nanoparticles described in this example was the same as that described in Example 1. The reaction conditions are given in the third column of Table 1. A significant difference in the laser pyrolysis conditions used to produce the nanoparticles of Example 3 relative to the conditions used to produce the nanoparticles of Examples 1 and 2 were the use of a lower chamber pressure.

Figure 12:
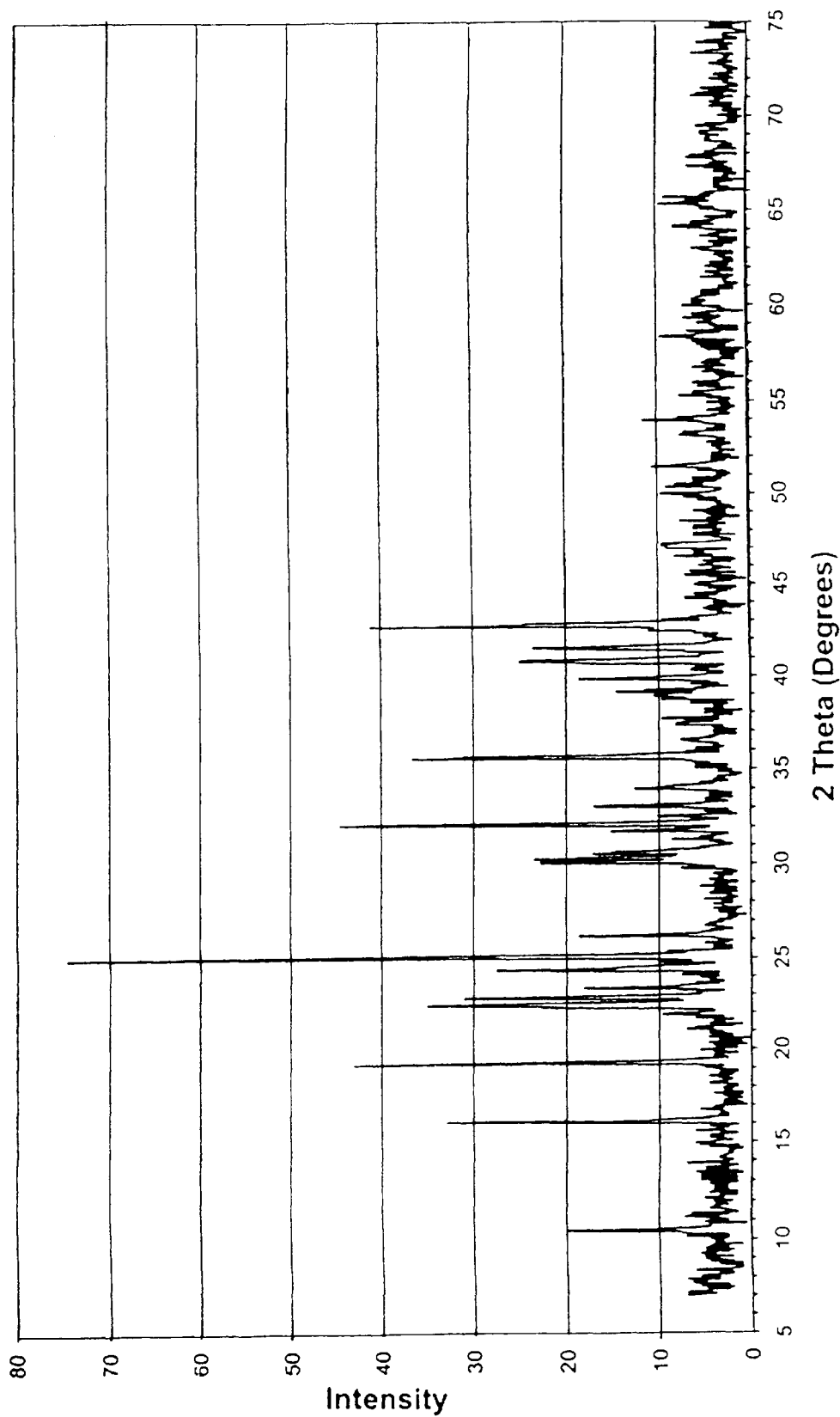
FIG. 12 is an x-ray diffractogram of $SnO_x$ nanoparticles of Example 3.
Figure 13:
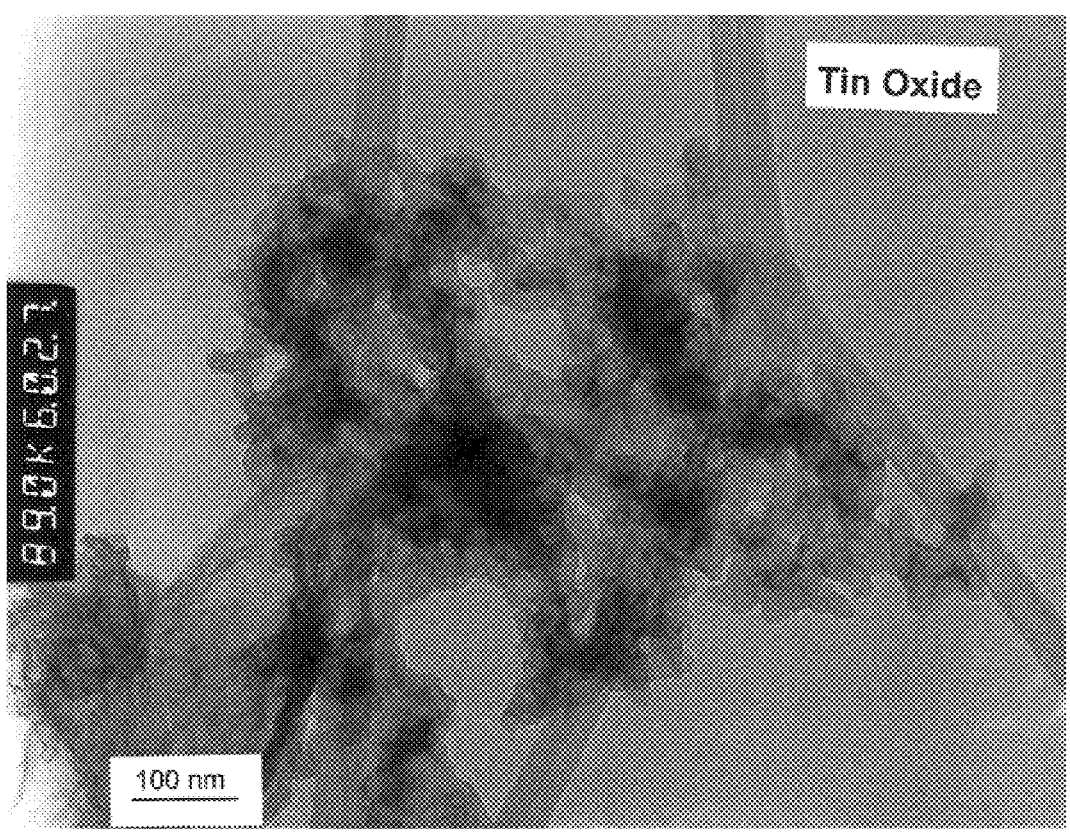
FIG. 13 is a TEM micrograph of nanoparticles of Example 3.

The x-ray diffractogram for this material is shown in FIG. 12. Compared with the diffractograms in FIGS. 6 and 10, the diffractogram in FIG. 12 had several extra peaks. These peaks may arise from residual tin chloride. This possibility is supported by the TEM image, as shown in FIG. 13. Some residual tin chloride can be seen as dark images covering some of the particles. From an examination of the micrograph, the average particle size was around 30 nm.

Example 4—Crystalline $SnO_2$, Oven Processed

Figure 14:
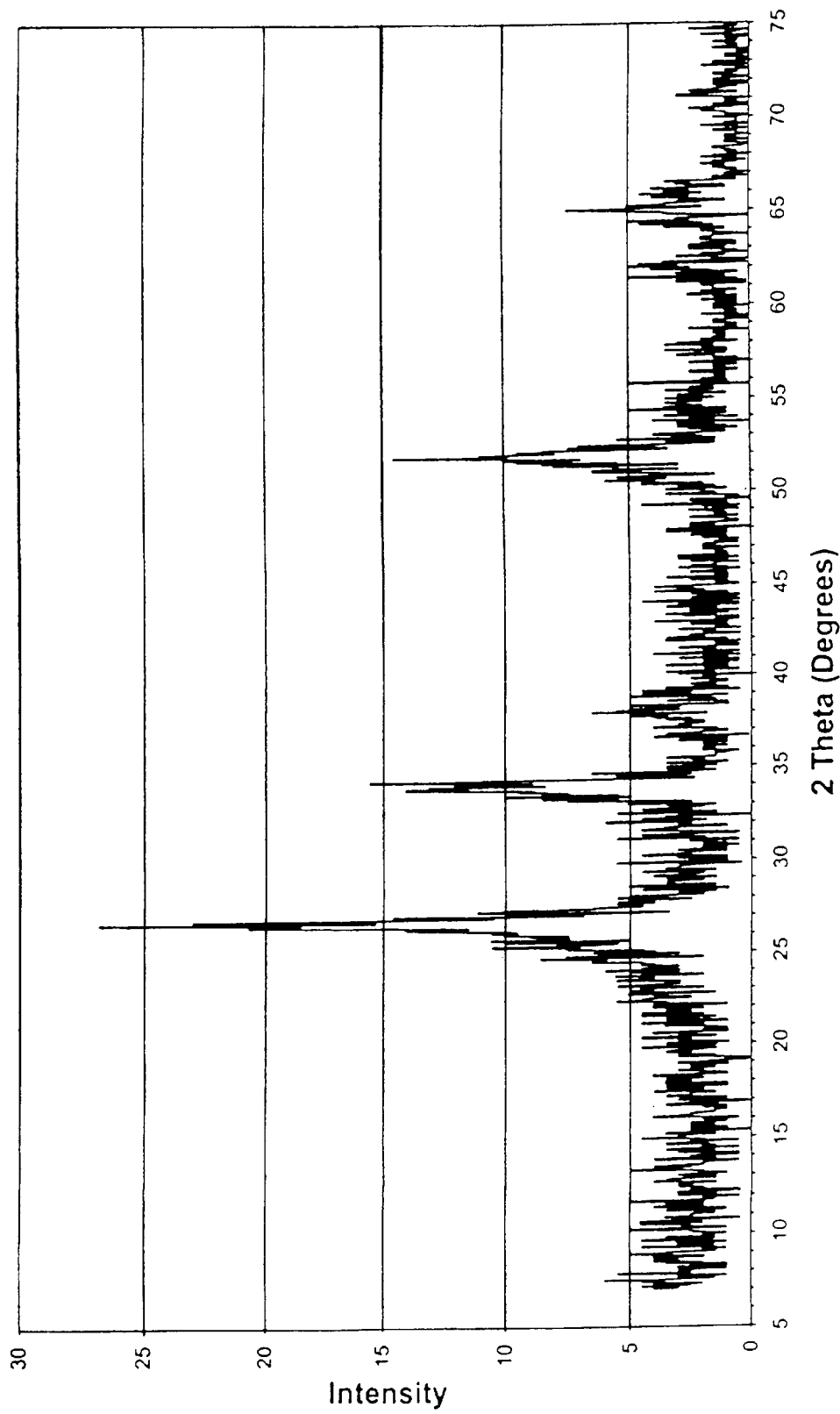
FIG. 14 is an x-ray diffractogram of $SnO_2$ nanoparticles of Example 4.

A sample of crystalline $SnO_x$ as described in Example 1 was baked in an oven under oxidizing conditions. The oven was essentially as described in FIG. 5. The samples were baked in the oven at about 300° C. for about 12 hours. Oxygen gas flowed through a 1.0 in diameter quartz tube at a flow rate of about 106 sccm. Between about 100 and about 300 mg of nanoparticles were placed in an open 1 cc vial within the quartz tube projecting through the oven. The resulting nanoparticles were single phase $SnO_2$ (Cassiterite) nanoparticles. The corresponding x-ray diffractogram is presented in FIG. 14.

Figure 15:
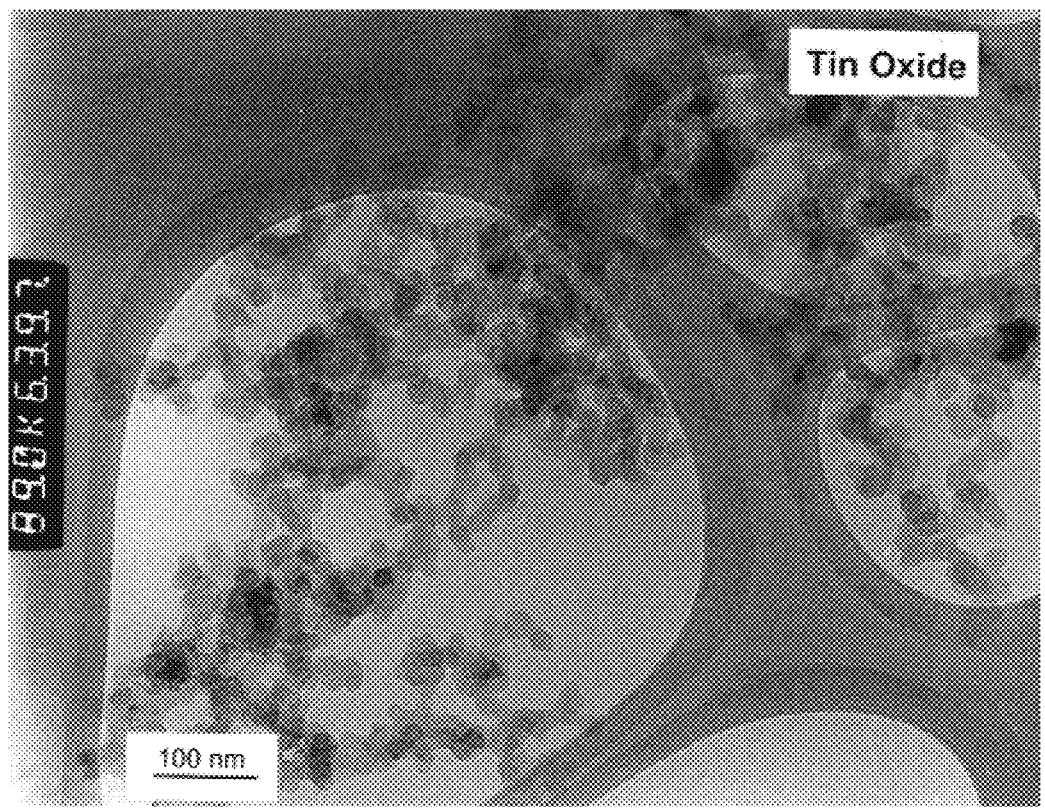
FIG. 15 is a TEM micrograph of nanoparticles of Example 4.
Figure 16:
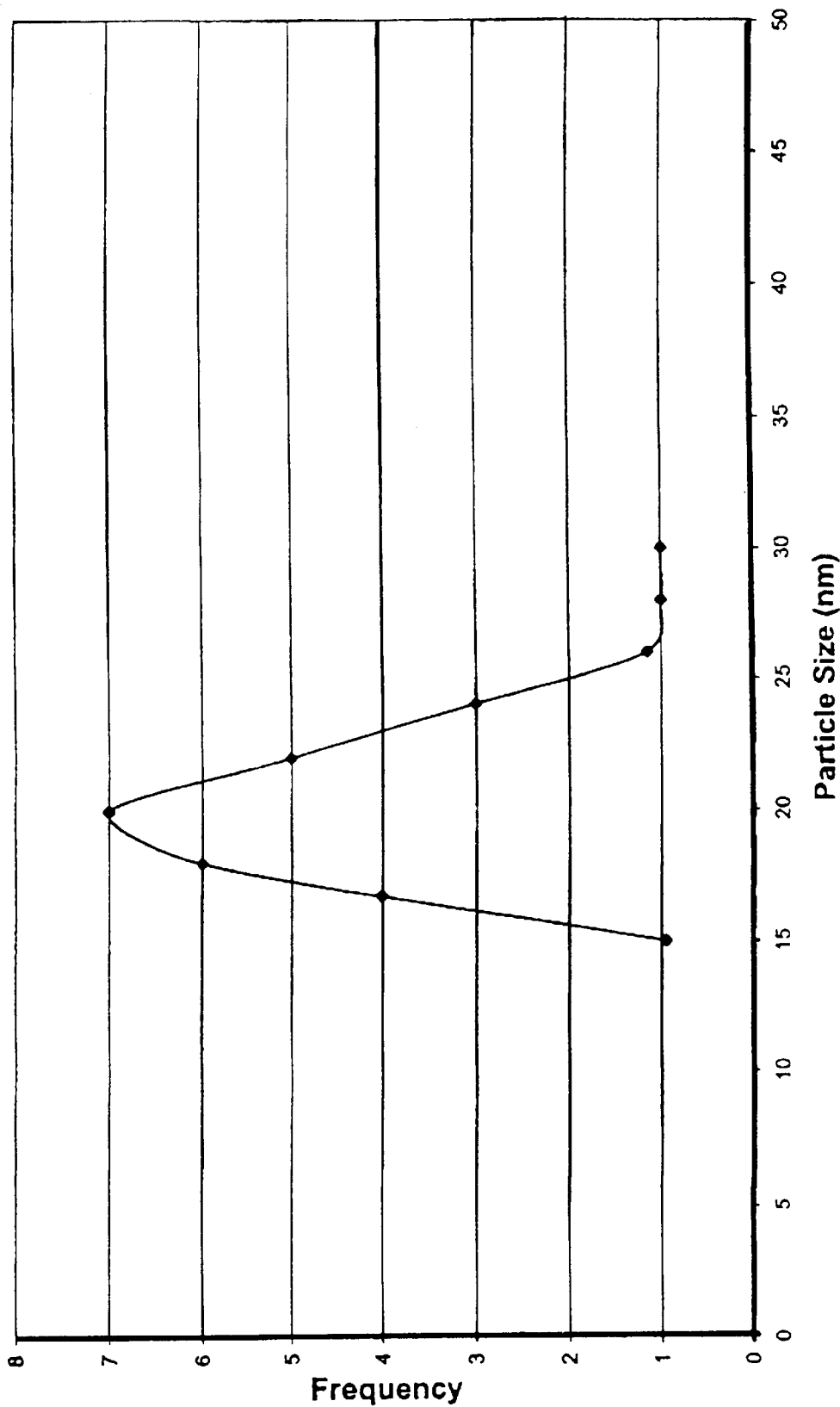
FIG. 16 is a plot of the distribution of particle diameters for the nanoparticles of Example 4 based on the micrograph of FIG. 15.

A TEM micrograph of these nanoparticles is shown in FIG. 15. A uniform size and shape was obtained again. The average particle diameter was about 20 nm. The particle size distribution is depicted in FIG. 16. The distribution in FIG. 16 is very similar to the distribution in FIG. 8, indicating that little if any sintering of the particles occurred.

The embodiments described above are intended to be representative and not limiting. Additional embodiments of the invention are within the claims. As will be understood by those skilled within the art, many changes in the methods and apparatus may be made by the skilled practitioner without departing from the spirit and scope of the invention, which should be limited only as set forward in the claims which follow.

What is claimed is:

1. A collection of particles comprising crystalline tin oxide, the tin oxide particles having an average diameter of about 500 nm or less, wherein at least about 95 percent of the nanoparticles have a diameter greater than about 50 percent of the average diameter and less than about 150 percent of the average diameter.

2. The collection of particles of claim 1 having an average diameter of about 100 nm or less.

3. The collection of particles of claim 1 having an average diameter from about 5 nm to about 50 nm.

4. The collection of particles of claim 1 wherein the tin oxide has a stoichiometry of $SnO_2$.

5. The collection of particle of claim 1 wherein at least about 99 percent of the nanoparticles have a diameter greater than about 50 percent of the average diameter and less than about 150 percent of the average diameter.

6. The collection of particles of claim 1 wherein at least about 95 percent of the nanoparticles have a diameter greater than about 60 percent of the average diameter and less than about 140 percent of the average diameter.

7. The collection of particles of claim 1 wherein the particles are roughly spherical in appearance.

8. The collection of particles of claim 1 wherein the tin oxide has a single crystalline phase.

9. A device comprising a coating, the coating comprising particles of claim 1.

10. The device of claim 9 wherein the device comprises a gas sensor.

11. The device of claim 9 wherein the device comprises a display and wherein the coating functions as a transparent electrode.

12. A collection of crystalline tin oxide particles yielding an x-ray diffraction pattern using Cu(Kα) radiation with line positions at values of 2 theta of 25.0°, 30.0°, 32.1°, 35.5°, 41.2°, 42.6°, 64.9°.

13. The collection of particles of claim 1 wherein the tin oxide particles have a tetragonal crystal structure.

14. The collection of particles of claim 1 wherein the tin oxide particles have a cassiterite crystal structure.

15. The collection of particles of claim 1 wherein essentially no particles have an average diameter greater than about 3 times the average diameter.

16. The collection of particles of claim 12 wherein the particles have an average diameter less than about 500 nm.

17. The collection of particles of claim 12 wherein the particles have an average diameter from about 5 nm to about 100 nm.

18. The collection of particles of claim 12 wherein the particles have an average diameter from about 5 nm to about 50 nm.

19. The collection of particles of claim 12 wherein at least about 95 percent of the particles have a diameter greater than about 50 percent of the average diameter and less than about 150 percent of the average diameter.

20. The collection of particles of claim 12 wherein at least about 95 percent of the particles have a diameter greater than about 60 percent of the average diameter and less than about 140 percent of the average diameter.

21. The collection of particles of claim 12 wherein the particles are roughly spherical in appearance.

* * * * *